United States Patent
Railkar et al.

(10) Patent No.: US 10,906,274 B2
(45) Date of Patent: Feb. 2, 2021

(54) LAMINATE SUBSTRATE WITH SINTERED COMPONENTS

(71) Applicant: Qorvo US, Inc., Greensboro, NC (US)

(72) Inventors: Tarak A. Railkar, Plano, TX (US); Deepukumar M. Nair, Lake Mary, FL (US); Jeffrey Dekosky, Winter Garden, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/543,043

(22) Filed: Aug. 16, 2019

(65) Prior Publication Data
US 2020/0147938 A1 May 14, 2020

Related U.S. Application Data (60) Provisional application No. 62/760,970, filed on Nov. 14, 2018.

(51) Int. Cl.
| | |
|---|---|
| *C04B 35/468* | (2006.01) |
| *B32B 18/00* | (2006.01) |
| *C04B 35/581* | (2006.01) |
| *C04B 35/47* | (2006.01) |
| *C04B 35/10* | (2006.01) |

(Continued)

(52) U.S. Cl.
CPC .......... *B32B 18/00* (2013.01); *B22F 1/0059* (2013.01); *B22F 7/04* (2013.01); *C04B 35/10* (2013.01); *C04B 35/468* (2013.01); *C04B 35/47* (2013.01); *C04B 35/581* (2013.01); *C04B 41/5036* (2013.01); *C04B 41/87* (2013.01); *H01L 29/945* (2013.01); *H01F 17/0006* (2013.01); *H01G 4/12* (2013.01)

(58) Field of Classification Search
CPC ....... C04B 41/87; C04B 35/581; C04B 35/47; C04B 35/468; C04B 35/10
See application file for complete search history.

(56) References Cited

U.S. PATENT DOCUMENTS 9,589,864 B2 3/2017 Railkar
2019/0244729 A1* 8/2019 Seitz .................. C04B 41/5194

OTHER PUBLICATIONS

Lee, Hwan, et al., "Fully Embedded LC Diplexer Passive Circuit into an Organic Package Substrate," Microwave and Optical Technology Letters, vol. 49, Issue 12, Dec. 2007, pp. 2960-2963.

* cited by examiner

*Primary Examiner* — Selim U Ahmed
*Assistant Examiner* — Evan G Clinton
(74) *Attorney, Agent, or Firm* — Withrow & Terranova, P.L.L.C.

(57) ABSTRACT

The present disclosure relates to a laminate substrate with sintered components. The disclosed laminate substrate includes a substrate body having an opening through the substrate body, a first foil layer, a sintered base component, and a sintered contact film. The first foil layer is formed underneath the substrate body, such that a first portion of the first foil layer fully covers the bottom of the opening. The sintered base component is formed within the opening and over the first portion of the first foil layer. Herein, the sintered base component has a dielectric constant between 10 and 500, or has a relative permeability greater than 5. The sintered contact film is formed over the sintered base component. The sintered base component is confined within the opening by the substrate body on sides, by the first foil layer on the bottom, and by the sintered contact film on the top.

22 Claims, 10 Drawing Sheets (51) Int. Cl.
    *B22F 1/00*           (2006.01)
    *B22F 7/04*           (2006.01)
    *C04B 41/50*         (2006.01)
    *C04B 41/87*         (2006.01)
    *H01L 29/94*         (2006.01)
    H01F 17/00         (2006.01)
    H01G 4/12          (2006.01)

LAMINATE SUBSTRATE WITH SINTERED COMPONENTS

RELATED APPLICATIONS

This application claims the benefit of provisional patent application Ser. No. 62/760,970, filed Nov. 14, 2018, the disclosure of which is hereby incorporated herein by reference in its entirety.

This application is related to U.S. patent application Ser. No. 16/543,078, filed Aug. 16, 2019, entitled "PROCESS FOR MAKING LAMINATE SUBSTRATE WITH SINTERED COMPONENTS," the disclosure of which is hereby incorporated herein by reference in its entirety.

FIELD OF THE DISCLOSURE

The present disclosure relates to a laminate substrate and a process for making the same, and more particularly to a laminate substrate with sintered components, and a process to integrate sintered components in the laminate substrate.

BACKGROUND

With the popularity of portable communication devices, such as smart phones and so forth, numerous fabrication technologies are geared towards electronics miniaturization, functionality integration and densification. Embedding techniques are widely used in substrates of the communication devices to integrate more functionality and/or to save space. For instance, embedding a high thermal conductor component in the substrate will provide a low resistance heat path to thermal ground. In addition, the embedding techniques may also provide an attractive interconnect solution without wire bonding for improved electrical performance, and offer the potential to reduce manufacturing cost for complex products.

In the communication devices, capacitors and inductors are commonly used in electronic signal filtering, decoupling, and transformer functionalities. In some cases, these capacitors and inductors could be significantly space consuming. Accordingly, there remains a need for more efficient substrate designs, which realize integration of the capacitors and/or inductors in the substrate to reduce the device size. Further, there is also a need for the capacitance and/or inductance of these integrated components to be tuned for optimum performance. Further, the design and fabrication of substrates with such integrated functionality should not add significant cost or increase implementation complexity.

SUMMARY

The present disclosure relates to a laminate substrate with sintered components. The disclosed laminate substrate includes a substrate body having a first opening through the substrate body, a first foil layer, a first sintered base component, and a first sintered contact film. The first foil layer is formed underneath the substrate body and extends underneath the first opening, such that a first portion of the first foil layer fully covers a bottom of the first opening. The first sintered base component is formed within the first opening and over the first portion of the first foil layer. Herein, the first sintered base component has a dielectric constant between 10 and 500, or has a relative permeability greater than 5. The first sintered contact film is formed over the first sintered base component. Herein, the first sintered base component is confined within the first opening by the substrate body on sides, by the first foil layer on the bottom, and by the first sintered contact film on the top.

In one embodiment of the laminate substrate, the first sintered base component includes at least one of barium strontium titanate (BST), aluminum nitride, or aluminum oxide.

In one embodiment of the laminate substrate, the first sintered base component includes at least one of iron, nickel, cobalt, or neodymium.

In one embodiment of the laminate substrate, the first sintered contact film includes at least one of copper, silver or gold.

In one embodiment of the laminate substrate, the first sintered contact film has a thickness between 100 μm and 200 μm.

According to another embodiment, the laminate substrate further includes a second sintered base component and a second sintered contact film. Herein, the substrate body further includes a second opening through the substrate body. The first foil layer extends underneath the second opening, such that a second portion of the first foil layer fully covers the bottom of the second opening. The second sintered base component is formed within the second opening and over the second portion of the first foil layer. The second sintered base component has a dielectric constant between 10 and 500, or has a relative permeability greater than 5. The second sintered contact film is formed over the second sintered base component. The second sintered base component is confined within the second opening by the substrate body on sides, by the first foil layer on the bottom, and by the second sintered contact film on the top.

In one embodiment of the laminate substrate, each of the first sintered base component and the second sintered base component has a dielectric constant between 10 and 500.

In one embodiment of the laminate substrate, the first sintered base component and the second sintered base component have a same dielectric constant.

In one embodiment of the laminate substrate, the first sintered base component and the second sintered base component have different dielectric constants.

In one embodiment of the laminate substrate, each of the first sintered base component and the second sintered base component has a relative permeability greater than 5.

In one embodiment of the laminate substrate, the first sintered base component and the second sintered base component have a same relative permeability.

In one embodiment of the laminate substrate, the first sintered base component and the second sintered base component have different relative permeabilities.

In one embodiment of the laminate substrate, the first sintered base component has a dielectric constant between 10 and 500, and the second sintered base component has a relative permeability greater than 5.

According to another embodiment, the laminate substrate further includes a second foil layer, which is formed over the substrate body and surrounds the first sintered contact film. Herein, the second foil layer does not extend over the first opening.

In one embodiment of the laminate substrate, the first foil layer and the second foil layer are formed of copper.

In one embodiment of the laminate substrate, a top surface of the first sintered base component is below a top surface of the substrate body with a distance between 0 and 300 μm.

According to another embodiment, the laminate substrate further includes a surface finish formed underneath the first foil layer. Herein, the surface finish is one of electroless nickel electroless palladium immersion gold (ENEPIG) finish, bussed nickel gold (NiAu) finish, bussless NiAu finish, and electroless nickel immersion gold (ENIG) finish.

According to another embodiment, the laminate substrate further comprising a surface finish formed over the second foil layer. Herein, the surface finish is one of a group consisting of ENEPIG finish, bussed NiAu finish, bussless NiAu finish, and ENIG finish.

In one embodiment of the laminate substrate, the surface finish does not extend over the first opening, such that the first sintered contact film is exposed.

In one embodiment of the laminate substrate, the surface finish extends over the first sintered contact film.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

It will be understood that for clear illustrations, FIGS. 1A-6I may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1A:
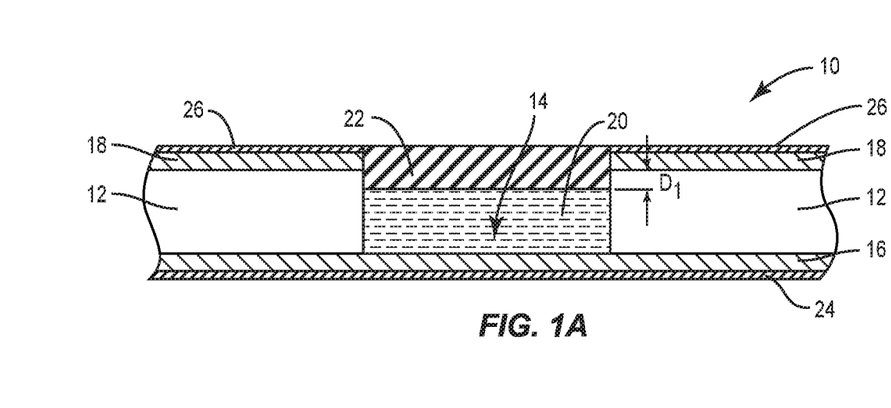
FIGS. 1A and 1B show an exemplary laminate substrate with sintered components according to one embodiment of the present disclosure.
Figure 1B:
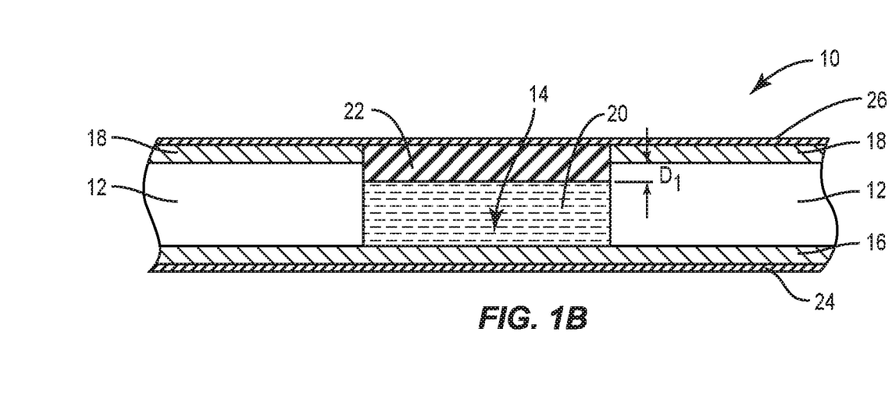

The present disclosure relates to a laminate substrate with sintered components, and a process for making the same. FIGS. 1A and 1B provide an exemplary laminate substrate 10 according to one embodiment of the present disclosure. Herein, the laminate substrate 10 includes a substrate body 12 with an opening 14, a first foil layer 16, a second foil layer 18, a sintered base component 20, and a sintered contact film 22.

In detail, the substrate body 12 has a top surface and a bottom surface opposite the top surface of the substrate body 12, and includes multiple substrate layers (not shown). The substrate body 12 may be formed from organic materials (such as flame retardant 4, Megtron-6, Rogers RO-6035, etc.) to provide a laminate structure. The opening 14 extends through the substrate body 12 from the top surface to the bottom surface of the substrate body 12. The first foil layer 16 is formed underneath the substrate body 12 and extends underneath the opening 14, such that a first portion of the first foil layer 16 fully covers the bottom of the opening 14. The second foil layer 18 is formed over the substrate body 12 and does not extend over the opening 14. The first foil layer 16 and the second foil layer 18 may be formed of copper, and each may have a thickness between 5 µm and 35 µm, or between 5 µm and 75 µm.

The sintered base component 20 is formed within the opening 14, and over the first portion of the first foil layer 16. The sintered base component 20 may fully or partially fill the opening 14, such that a top surface of the sintered base component 20 may be at a same plane as the top surface of the substrate body 12, or below the top surface of the substrate body 12. The top surface of the sintered base component 20 may be below the top surface of the substrate body 12 with a distance D1 between 0 and 300 µm. In addition, the sintered contact film 22 is formed over the sintered base component 20, and may not extend horizontally beyond the opening 14. The sintered contact film 22 may have a thickness between 100 µm and 200 µm. If the top surface of the sintered base component 20 is below the top surface of the substrate body 12, the sintered contact film 22 may extend vertically into the opening 14. Herein, the sintered base component 20 is confined within the opening 14 by the substrate body 12 on sides, by the first foil layer 16 on bottom, and by the sintered contact film 22 on top.

For capacitor applications, the sintered base component 20 may be formed from a ceramic sinterable base material, which includes ceramic particles mixed with a first base binder material. Materials, including ceramics, have a very high surface energy density, when their average particle size is of the order of nano-meter dimensions. When such minute particles come in physical contact with one another, they tend to agglomerate to reduce the combined surface energy. The purpose of the first base binder material is to prevent physical contact between the particles, thereby preventing them from agglomerating. The ceramic particles may be selected from barium strontium titanate (BST), aluminum nitride, aluminum oxide, and other suitable materials with a high dielectric constant between 10 and 500. The first base binder material may have an evaporation temperature between 150° C. and 250° C., and may include methylcellulose, phenolic resins, polyvinyl acetate, polyvinyl alcohol, polymethyl methacrylate and/or others. After sintering the ceramic sinterable base material, the first base binder material is evaporated, which results in agglomeration of the ceramic particles. Therefore, the ceramic sinterable base material solidifies into a densely packed solid form as the sintered base component 20 (see details in following processing descriptions). The sintered base component 20 may have a dielectric constant between 10 and 500, and may include at least one of BST, aluminum nitride, or aluminum oxide.

For radio frequency (RF) choke, inductor, and/or transformer applications, the sintered base component 20 may be formed from a ferro-magnetic sinterable base material, which includes ferro-magnetic particles mixed with a second base binder material. Materials, including ferro-magnetics, have a high surface energy density, when the average particle size is of the order of nano-meter dimensions. When such minute particles come in physical contact with one another, they tend to agglomerate to reduce the combined surface energy. The purpose of the second base binder material is to prevent physical contact between the particles, thereby preventing them from agglomerating. The ferro-magnetic particles may be selected from iron, nickel, cobalt, neodymium, and other suitable materials with a high relative permeability greater than 5. The second base binder material may have an evaporation temperature between 150° C. and 250° C., and may include zinc/lithium stearates, agar, polyacetal, water soluble polyvinyl alcohol, and/or others. After sintering the ferro-magnetic sinterable base material, the second base binder material is evaporated, which results in agglomeration of the ferro-magnetic particles. Therefore, the ferro-magnetic sinterable base material solidifies into a densely packed solid form as the sintered base component 20 (see details in following processing descriptions). In this embodiment, the sintered base component 20 may have a relative permeability greater than 5, and may include at least one of iron, nickel, cobalt, or neodymium.

The sintered contact film 22 may be formed from a sinterable contact material, which includes metal particulates of nanometer dimensions and a contact binder material that coats each of the metal particulates. At these dimensions, these metal particulates have high surface energy, which tends to agglomerate the metal particulates to reduce the collective surface energy, while the contact binder material that coats each of the metal particulates is used to prevent the metal particulates from agglomerating. The metal particulates may be selected from copper, silver, or gold. The contact binder material may have an evaporation temperature, between 150° C. and 250° C., and may include resin, rosin, and/or alcohol base. Note that the evaporation temperature of the contact binder material (in the sinterable contact material) may be higher than the evaporation temperature of the base binder material (the first or second base binder material) used in the sinterable base material (the ceramic or ferro-magnetic sinterable base material). After sintering the sinterable contact material, the contact binder material is evaporated, and the sinterable contact material solidifies into solid form as the sintered contact film 22 (see details in following processing descriptions). The sintered contact film 22 may include at least one of copper, silver, or gold.

The laminate substrate 10 may further include a first surface finish 24 and a second surface finish 26. The first surface finish 24 is formed underneath the first foil layer 16, and the second surface finish 26 is formed over the second foil layer 18. In one embodiment, the second surface finish 26 does not extend over the opening 14, such that the sintered contact film 22 is exposed at a top side of the laminate substrate 10 (FIG. 1A). In another embodiment, the second surface finish 26 extends over the sintered contact film 22 (FIG. 1B). Further, a top surface of the sintered contact film 22 may be above (not shown), below (FIG. 1B), or at a same plane (FIG. 1A) as a top surface of the second surface finish 26. The first surface finish 24 and the second surface finish 26 may be formed from a same finish or different finishes, such as electroless nickel electroless palladium immersion gold (ENEPIG) finish, bussed nickel gold (NiAu) finish, bussless NiAu finish, or electroless nickel immersion gold (ENIG) finish. In some applications, the first surface finish 24 and/or the second surface finish 26 may be omitted in the laminate substrate 10.

Figure 2A:
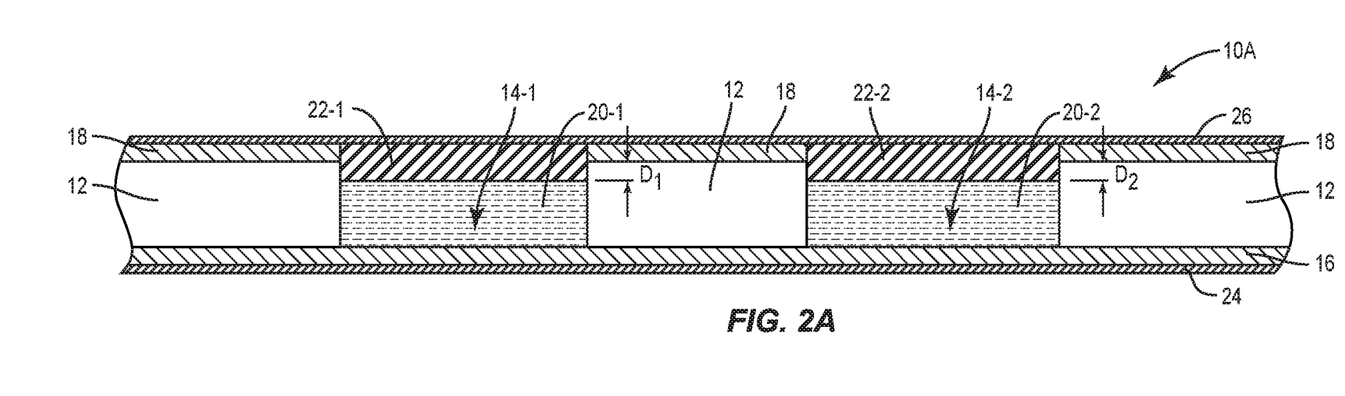
FIGS. 2A and 2B show an alternative laminate substrate according to one embodiment of the present disclosure.
Figure 2B:
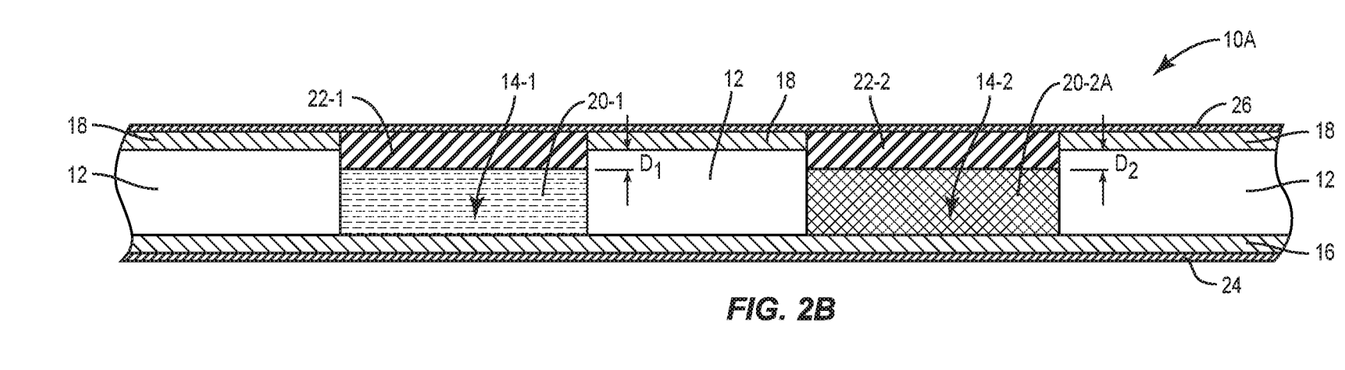

FIGS. 2A and 2B show an alternative laminate substrate 10A according to one embodiment of the present disclosure. Compared to the laminate substrate 10, the alternative laminate substrate 10A includes more than one opening within the substrate body 12. For the purpose of this illustration, the substrate body 12 includes a first opening 14-1 and a second opening 14-2. The first opening 14-1 and the second opening 14-2 are separate from each other, and both extend through the substrate body 12 from the top surface to the bottom surface of the substrate body 12. In different applications, the substrate body 12 may include more openings, and each opening may have a same or different size/shape.

The first foil layer 16 is formed underneath the substrate body 12, and extends underneath the first opening 14-1 and the second opening 14-2, such that a first portion of the first foil layer 16 fully covers the bottom of the first opening 14-1 and a second portion of the first foil layer 16 fully covers the bottom of the second opening 14-2. The second foil layer 18 is formed over the substrate body 12 and does not extend over any of the first opening 14-1 and the second opening 14-2. The first foil layer 16 and the second foil layer 18 may be formed of copper, and each may have a thickness between 5 µm and 35 µm, or between 5 µm and 75 µm.

Herein, a first sintered base component 20-1 is formed within the first opening 14-1, and over the first portion of the first foil layer 16. The first sintered base component 20-1 may fully or partially fill the first opening 14-1, such that a top surface of the first sintered base component 20-1 may be at a same plane as the top surface of the substrate body 12, or below the top surface of the substrate body 12. The top surface of the first sintered base component 20-1 may be below the top surface of the substrate body 12 with a distance D1 between 0 and 300 µm. Similarly, a second sintered base component 20-2 is formed within the second opening 14-2, and over the second portion of the first foil layer 16. The second sintered base component 20-2 may fully or partially fill the second opening 14-2, such that a top surface of the second sintered base component 20-2 may be at a same plane as the top surface of the substrate body 12, or below the top surface of the substrate body 12. The top surface of the second sintered base component 20-2 may be below the top surface of the substrate body 12 with a distance D2 between 0 and 300 µm. Note that the distance D1 and the distance D2 may be different or the same.

In addition, a first sintered contact film 22-1 is formed over the first sintered base component 20-1, and may not extend horizontally beyond the first opening 14-1. A second sintered contact film 22-2 is formed over the second sintered base component 20-2, and may not extend horizontally beyond the second opening 14-2. The first sintered contact film 22-1 and the second sintered contact film 22-2 may have a thickness between 100 µm and 200 µm. If the distance D1 (between the top surface of the first sintered base component 20-1 and the top surface of the substrate body 12) and the distance D2 (between the top surface of the second sintered base component 20-2 and the top surface of the substrate body 12) are different, a thickness of the first sintered contact film 22-1 and a thickness of the second sintered contact film 22-2 may be different. Herein, the first sintered base component 20-1 is confined within the first opening 14-1 by the substrate body 12 on sides, by the first foil layer 16 on the bottom, and by the first sintered contact film 22-1 on the top. The second sintered base component 20-2 is confined within the second opening 14-2 by the substrate body 12 on sides, by the first foil layer 16 on the bottom, and by the second sintered contact film 22-2 on the top.

The alternative laminate substrate 10A may further include the first surface finish 24 and the second surface finish 26. The first surface finish 24 is formed underneath the first foil layer 16, and the second surface finish 26 is formed over the second foil layer 18. In one embodiment, the second surface finish 26 extends over the first sintered contact film 22-1 and the second sintered contact film 22-2 (FIGS. 2A and 2B). In another embodiment, the second surface finish 26 does not extend over the first opening 14-1 or the second opening 14-2, such that the first sintered contact film 22-1 and the second sintered contact film 22-2 are exposed at a top side of the alternative laminate substrate 10A (not shown). The first surface finish 24 and the second surface finish 26 may be formed from a same finish or different finishes, such as ENEPIG finish, bussed NiAu finish, bussless NiAu finish, or ENIG finish. Further, the first surface finish 24 and/or the second surface finish 26 may be omitted in the alternative laminate substrate 10A.

In different applications, the first sintered base component 20-1 and the second sintered base component 20-2 may be formed from a same sinterable base material (as shown in FIG. 2A), or may be formed from different sinterable base materials (as shown in FIG. 2B). For instance, a first sinterable base material used for the first sintered base component 20-1 and a second sinterable base material used for the second sintered base component 20-2 are a same ceramic sinterable base material or a same ferro-magnetic sinterable base material. As such, the first sintered base component 20-1 and the second sintered base component 20-2 have a same dielectric constant (between 10 and 500) or a same relative permeability (greater than 5).

In one embodiment, both the first sinterable base material used for the first sintered base component 20-1 and the second sinterable base material used for the second sintered base component 20-2 are ceramic sinterable base materials. However, the first sinterable base material used for the first sintered base component 20-1 and the second sinterable base material used for the second sintered base component 20-2 may include different types of ceramic particles. The first sintered base component 20-1 and the second sintered base component 20-2, therefore, may have different dielectric constants. Similarly, both the first sinterable base material used for the first sintered base component 20-1 and the second sinterable base material used for the second sintered base component 20-2 are ferro-magnetic sinterable base materials. However, the first sinterable base material used for the first sintered base component 20-1 and the second sinterable base material used for the second sintered base component 20-2 may include different types of ferro-magnetic particles. The first sintered base component 20-1 and the second sintered base component 20-2, therefore, may have different relative permeabilities. In another embodiment, the first sinterable base material used for the first sintered base component 20-1 is a ceramic sinterable base material, while the second sinterable base material used for the second sintered base component 20-2 is a ferro-magnetic sinterable base material.

The first sintered contact film 22-1 and the second sintered contact film 22-2 may be formed from a same sinterable contact material, which includes metal particulates with a contact binder material. Note that the evaporation temperature of the contact binder material (in the sinterable contact material) may be higher than the evaporation temperature(s) of the base binder material(s) (in the first sinterable base material and the second sinterable base material).

Figure 3:
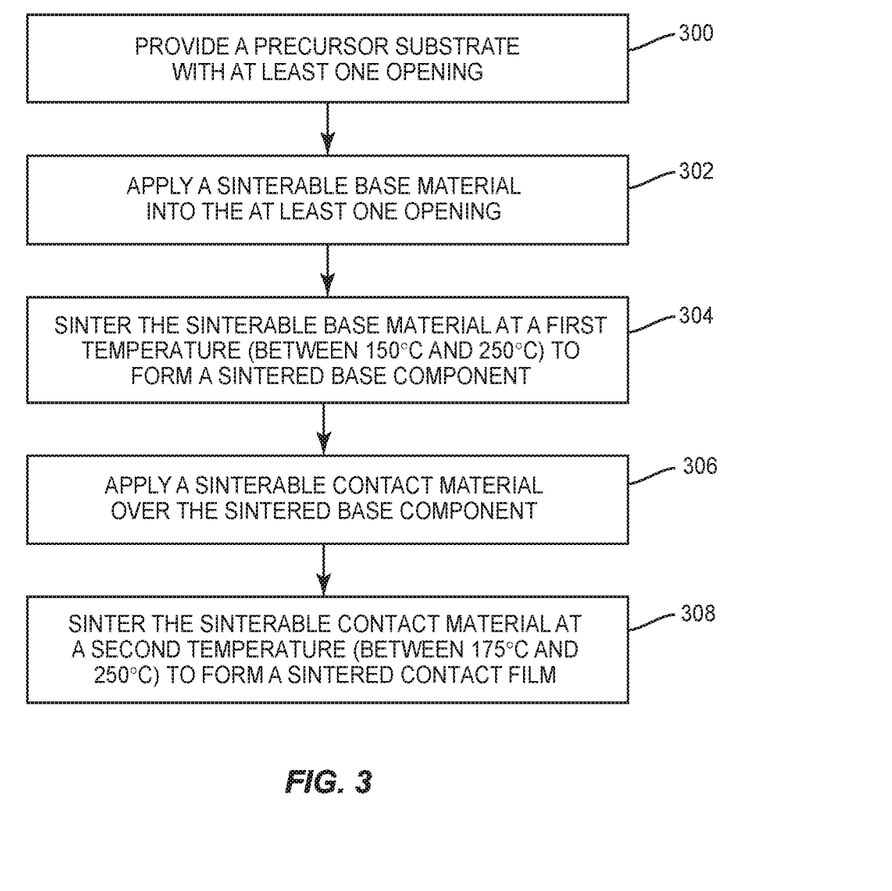
FIG. 3 provides a flow diagram illustrating an exemplary process to form the laminate substrate shown in FIG. 1A.

FIG. 3 provides a flow diagram that illustrates an exemplary process to form the laminate substrate 10 shown in FIG. 1A according to one embodiment of the present disclosure. FIGS. 4A-4E illustrate the steps associated with the process provided in FIG. 3. Although the steps in FIGS. 4A-4E are illustrated in a sequential order, these steps are not necessarily order dependent. Some steps may be performed in a different order than presented. Further, fewer or more steps may be performed than those illustrated in FIGS. 4A-4E.

Figure 4A:
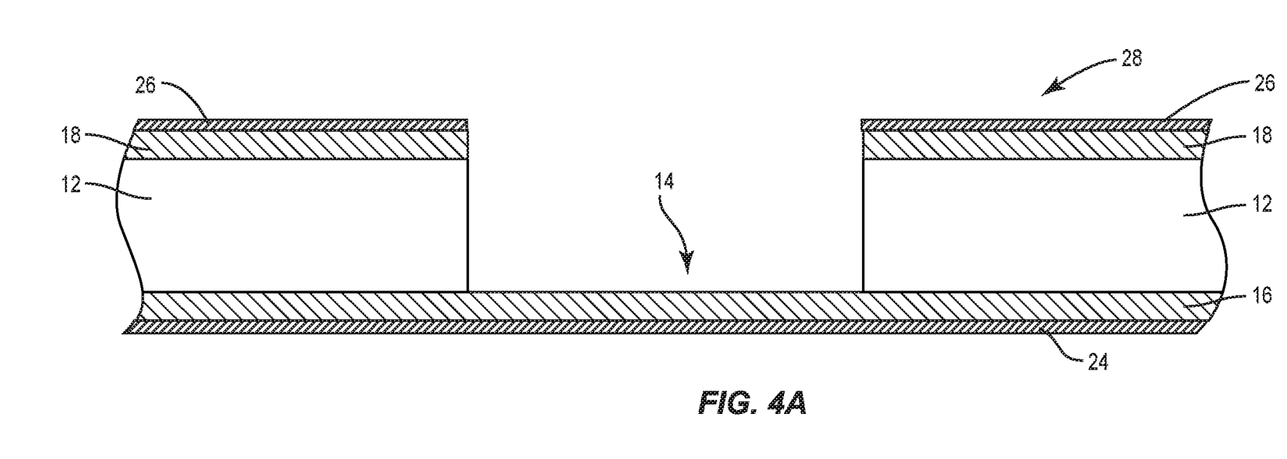
FIGS. 4A-4E illustrate the steps associated with the process provided in FIG. 3.

The process shown in FIG. 3 may be performed during a component assembly process. Initially, a precursor substrate 28, which includes the substrate body 12, the first foil layer 16, the second foil layer 18, the first surface finish 24, and the second surface finish 26, is provided as depicted in FIG. 4A (Step 300). For the purpose of this illustration, the substrate body 12 has the opening 14 extending through the substrate body 12 from the top surface to the bottom surface of the substrate body 12. In different applications, the substrate body 12 may have more openings extending through the substrate body 12. The first foil layer 16 is formed underneath the substrate body 12 and extends underneath the opening 14, such that the first portion of the first foil layer 16 fully covers the bottom of the opening 14. The second foil layer 18 is formed over the substrate body 12 and does not extend over the opening 14. The first surface finish 24 is formed underneath the first foil layer 16, and the second surface finish 26 is formed over the second foil layer 18 but does not extend over the opening 14. In some applications, the precursor substrate 28 may not include the first surface finish 24 and/or the second surface finish 26.

Figure 4B:
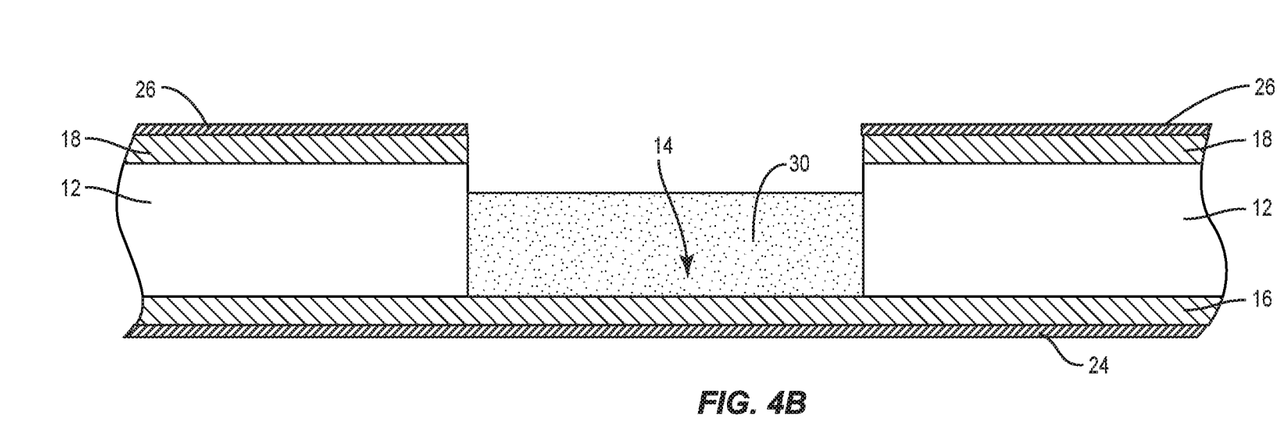

Next, a sinterable base material 30 is applied into the opening 14 and over the first portion of the first foil layer 16, as illustrated in FIG. 4B (Step 302). The sinterable base material 30 may not extend vertically beyond the top surface of the substrate body 12. The sinterable base material 30 may include ceramic particles mixed with a first base binder material, or ferro-magnetic particles mixed with a second base binder material (not shown). The ceramic particles may be selected from BST, aluminum nitride, aluminum oxide, and other suitable particulates with a high dielectric constant between 10 and 500. The first base binder material has an evaporation temperature between 150° C. and 250° C., and may include methylcellulose, phenolic resins, polyvinyl acetate, polyvinyl alcohol, polymethyl methacrylate and/or others. The ferro-magnetic particles may be selected from iron, nickel, cobalt, neodymium, and other suitable particulates with a high relative permeability greater than 5. The second base binder material has an evaporation temperature between 150° C. and 250° C., and may include zinc/lithium stearates, agar, polyacetal, water soluble polyvinyl alcohol, and/or others. The sinterable base material 30 may be applied by dispensing, screen printing, etc.

Figure 4C:
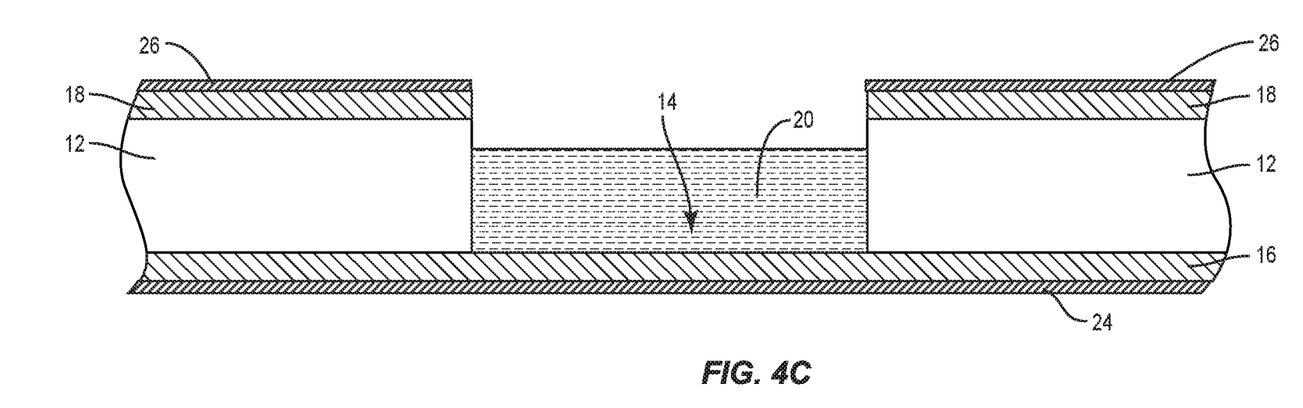

A first sintering step is followed to sinter the sinterable base material 30 within the opening 14 to form the sintered base component 20, as illustrated in FIG. 4C (Step 304). During the first sintering step, the first or second base binder material within the sinterable base material 30 evaporates and escapes as a gaseous byproduct of the first sintering step. As a consequence, the ceramic/ferro-magnetic particles agglomerates and forms a densely packed cluster/solid. The sinterable base material 30 may be sintered at a first sintering temperature between 150° C. and 250° C., which is high enough for the evaporation of the first or second base binder material. The first sintering temperature and duration is subject to different base binder materials.

Figure 4D:
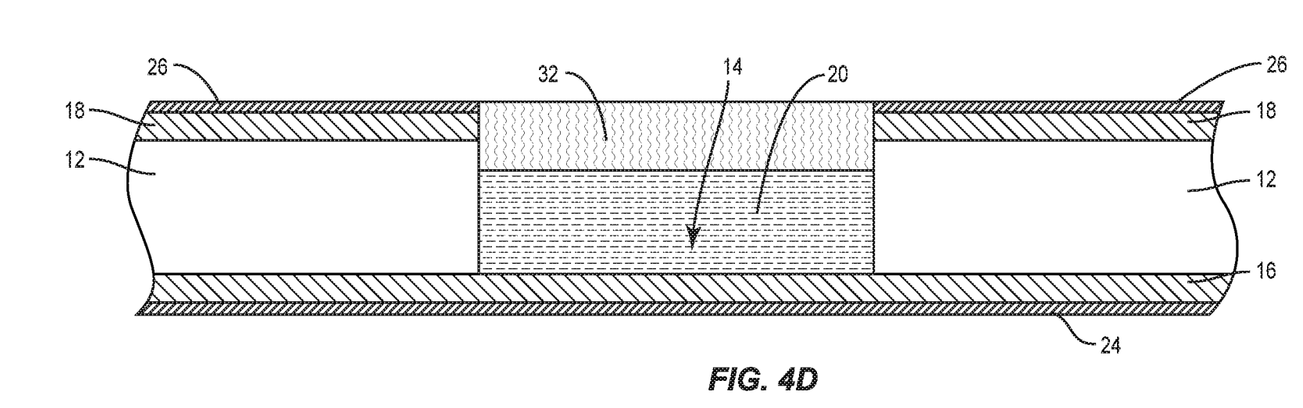

A sinterable contact material 32, which includes metal particulates with sub-nanometer dimensions and a contact binder material, is then applied over the sintered base component 20, as illustrated in FIG. 4D (Step 306). As such, the sintered base component 20 is confined within the opening 14 by the substrate body 12 on the sides, by the first foil layer 16 on the bottom, and by the sinterable contact material 32 on the top. The metal particulates in the sinterable contact material 32 may be selected from copper, silver, or gold. The contact binder material has an evaporation temperature, between 150° C. and 250° C. The sinterable contact material 32 may be applied by dispensing, screen printing, etc.

Figure 4E:
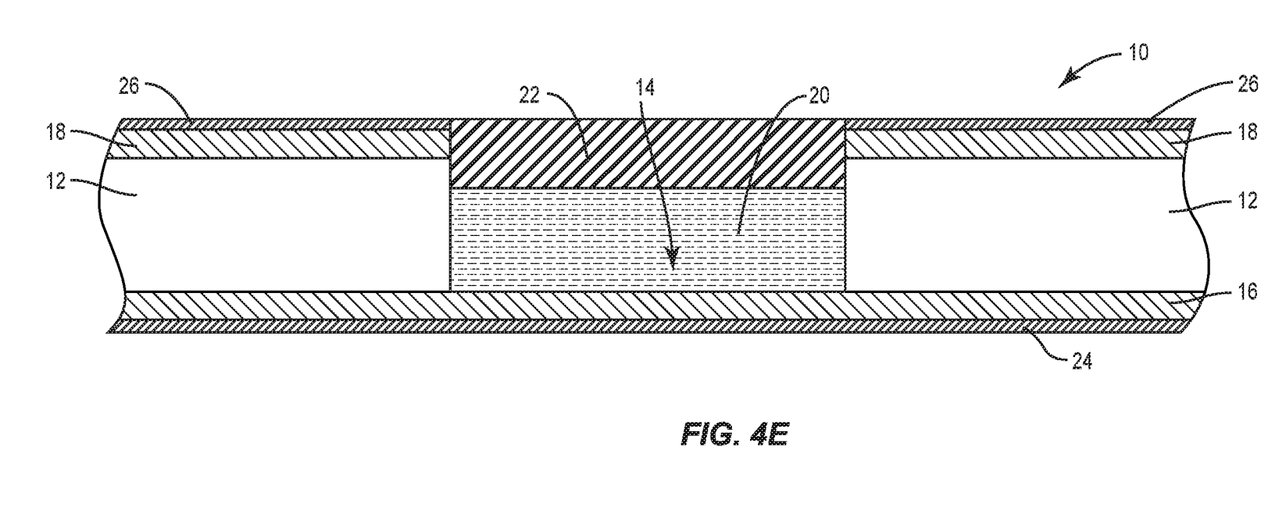

A second sintering step is followed to sinter the sinterable contact material 32 to form the sintered contact film 22 and complete the laminate substrate 10, as illustrated in FIG. 4E (Step 308). During the second sintering step, the contact binder material within the sinterable contact material 32 evaporates and escapes as a gaseous byproduct of the second sintering step. As a consequence, the metal particulates agglomerate and form a near-homogeneous solid. As a result, the sintered base component 20 is confined within the opening 14 by the substrate body 12 on the sides, by the first foil layer 16 on the bottom, and by the sintered contact film 22 on the top. The sinterable contact material 32 may be sintered at a second sintering temperature between 175° C. and 250° C., which is high enough for the evaporation of the contact binder material. The second sintering temperature and duration is subject to different contact binder materials.

In one embodiment, if the evaporation temperature of the contact binder material (in the sinterable contact material 32) is higher than the evaporation temperature of the first or second base binder material (in the sinterable base material 30), the first and second sintering steps may be executed after applying the sinterable base material 30 and the sinterable contact material 32 (not shown). Herein, the sinterable contact material 32 is applied over the sinterable base material 30 instead of the sintered base component 20. During the first sintering step, the first sintering temperature is set to evaporate the first or second base binder material used in the sinterable base material 30, but not to evaporate the contact binder material used in the sinterable contact material 32. As such, the first or second base binder material from the sinterable base material 30 escapes away into the external ambience without being trapped by the sinterable contact material 32, and the sinterable base material 30 solidifies into sintered form as the sintered base component 20. Once the first or second base binder material evaporates, the first sintering temperature is raised to the second sintering temperature, which is set to evaporate the contact binder material in the sinterable contact material 32. As such, the contact binder material from the sinterable contact material 32 escapes away into the external ambience, and the sinterable contact material 32 solidifies into sintered form as the sintered contact film 22.

Lastly, a polishing step may be applied to planarize the top surface of the sintered contact film 22 (not shown). In different applications, the top surface of the sintered contact film 22 may be above, below, or at the same plane as the top surface of the second surface finish 26. One or more electronic components, such as semiconductor dies, or passive surface mounted devices, may be mounted on the laminate substrate 10.

Figure 5:
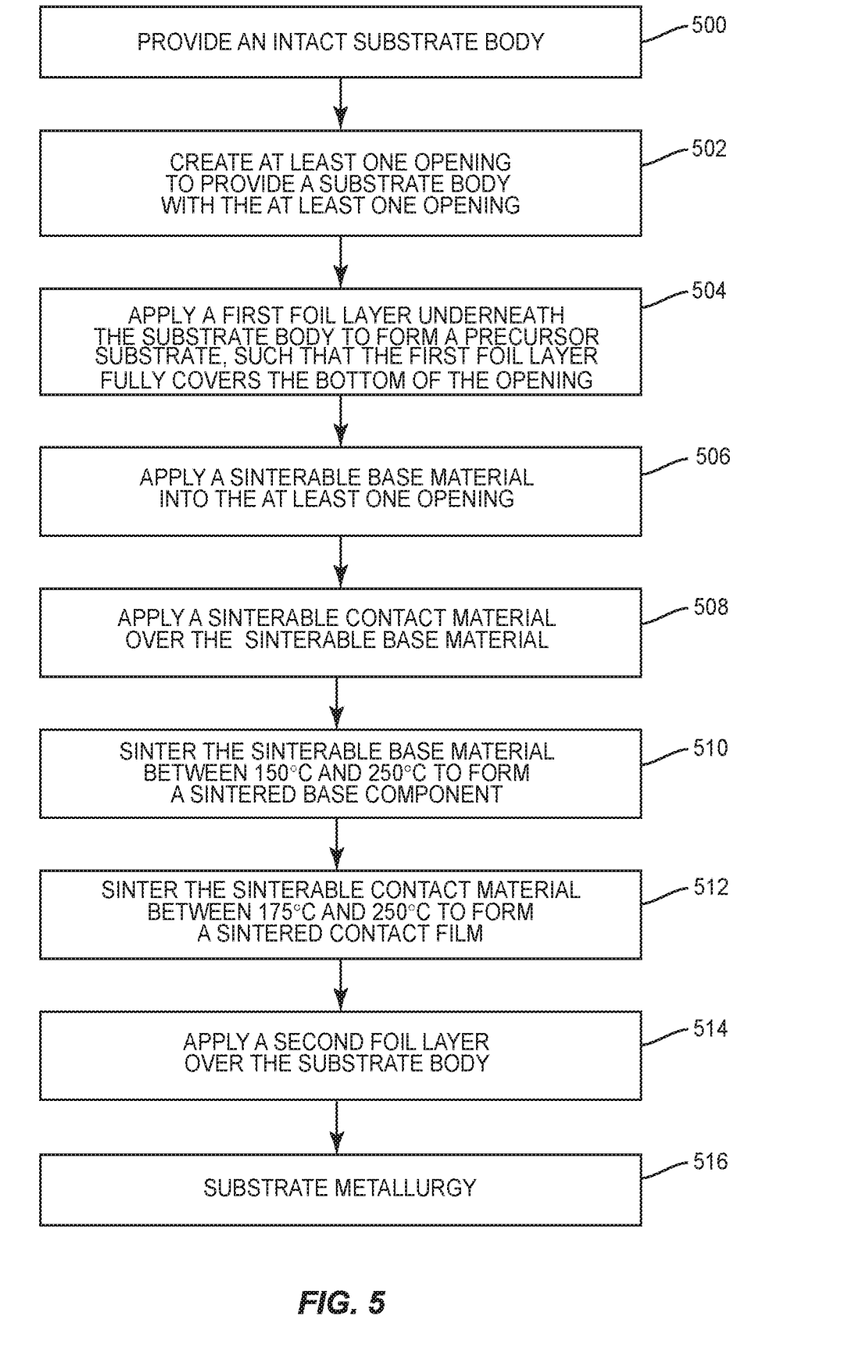
FIG. 5 provides a flow diagram illustrating an alternative process to form the laminate substrate shown in FIG. 1B.

FIG. 5 provides a flow diagram that illustrates an alternative process to form the laminate substrate 10 shown in FIG. 1B, according to one embodiment of the present disclosure. FIGS. 6A-6I illustrate the steps associated with the process provided in FIG. 5. Although the steps in FIGS. 6A-6I are illustrated in a sequential order, these steps are not necessarily order dependent. Some steps may be performed in a different order than that presented. Further, fewer or more steps may be performed than those illustrated in FIGS. 6A-6I.

Figure 6A:
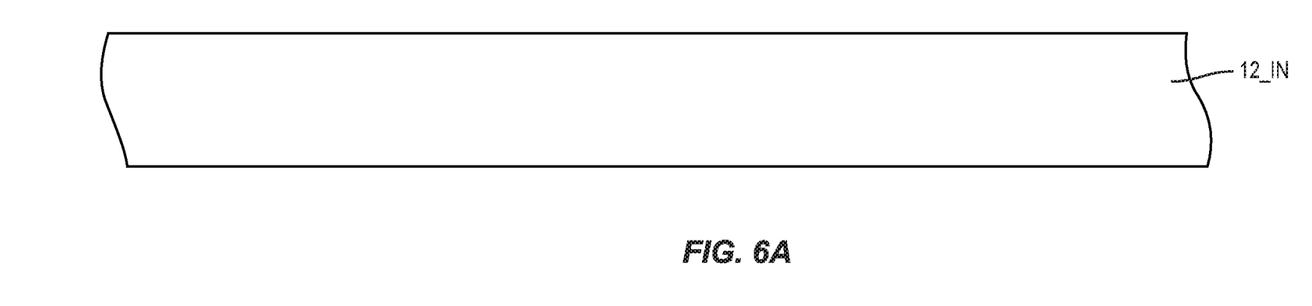
FIGS. 6A-6I illustrate the steps associated with the process provided in FIG. 5.
Figure 6B:
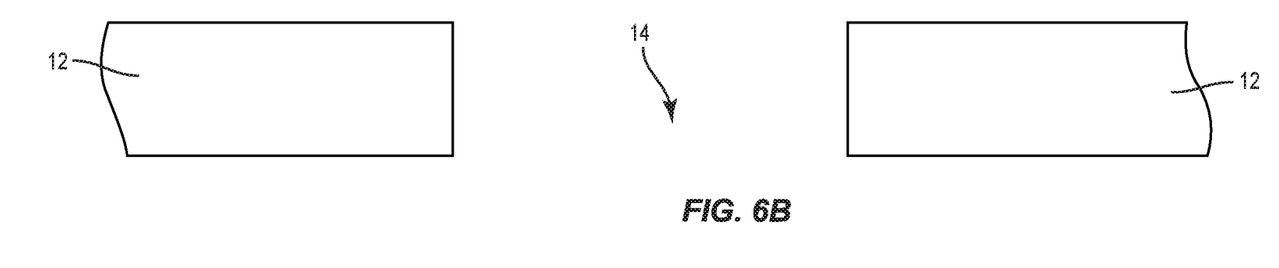

The process shown in FIG. 5 may be performed during a laminate fabrication process. Initially, an intact substrate body 12_IN is provided, as depicted in FIG. 6A (Step 500). The intact substrate body 12_IN of the described embodiment may be formed from organic materials (such as flame retardant 4, Megtron-6, Rogers RO-6035, etc.) to provide a laminate structure. The opening 14 is then created from a top surface to a bottom surface of the intact substrate body 12_IN to provide the substrate body 12 with the opening 14, as illustrated in FIG. 6B (Step 502). The size of the opening 14 is between 1 mm×1 mm and 10 mm×10 mm, with a square shape. In different applications, different numbers, different sizes, and/or different shapes of openings may be created in the substrate body 12. The opening 14 may be created by various procedures, such as a punching process, a laser ablation process, a mechanical drilling process, or other suitable methods.

Figure 6C:
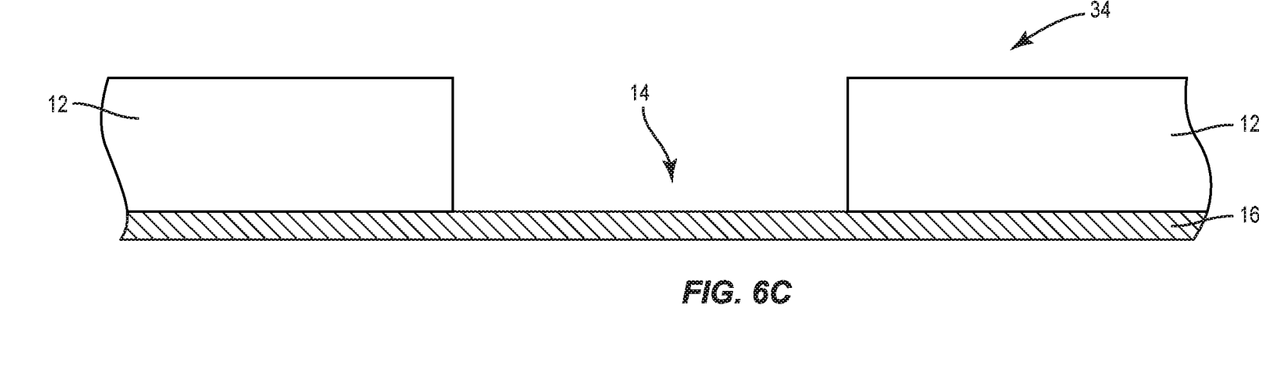
Figure 6D:
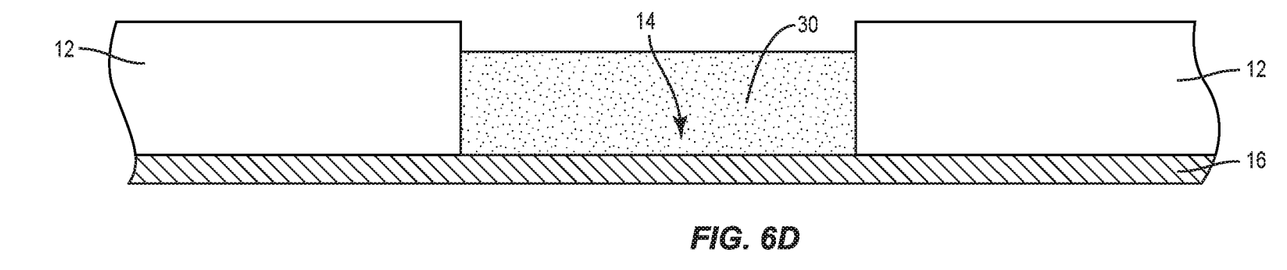

Next, the first foil layer 16 is applied underneath the substrate body 12 and extends underneath the opening 14 to form a precursor substrate 34, as illustrated in FIG. 6C (Step 504). As such, the first portion of the first foil layer 16 fully covers the bottom of the opening 14. The first foil layer 16 may be formed of copper, and may have a thickness between 5 µm and 35 µm, or between 5 µm and 75 µm. The sinterable base material 30 is then applied into the opening 14 and over the first portion of the first foil layer 16, as illustrated in FIG. 6D (Step 506). The sinterable base material 30 may not extend vertically beyond the top surface of the substrate body 12. The sinterable base material 30 may include the ceramic particles mixed with the first base binder material, or the ferro-magnetic particles mixed with the second base binder material (not shown). The sinterable base material 30 may be applied by dispensing, screen printing, etc.

Figure 6E:
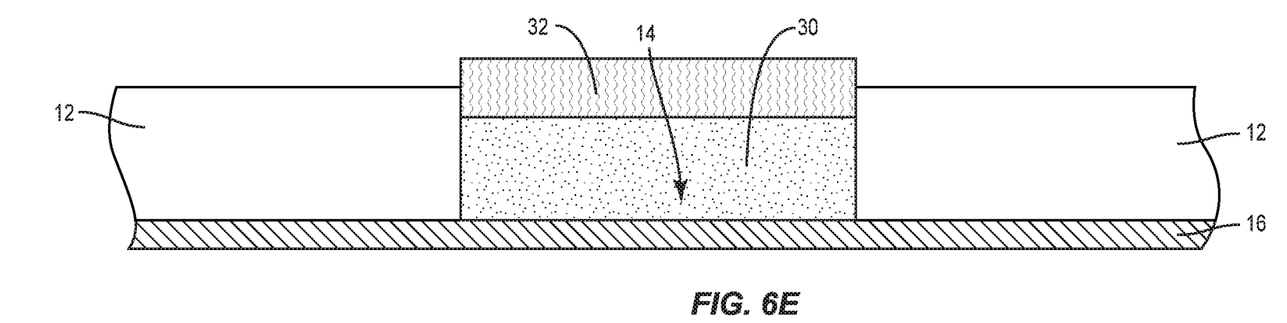

The sinterable contact material 32, which includes the metal particulates and the contact binder material is then applied over the sinterable base material 30, as illustrated in FIG. 6E (Step 508). The sinterable contact material 32 may extend vertically beyond the top surface of the substrate body 12. Note that the evaporation temperature of the contact binder material (in the sinterable contact material 32) may be higher than the evaporation temperature of the first or second base binder material (in the sinterable base material 30). The sinterable contact material 32 may be applied by dispensing, screen printing, etc.

Figure 6F:
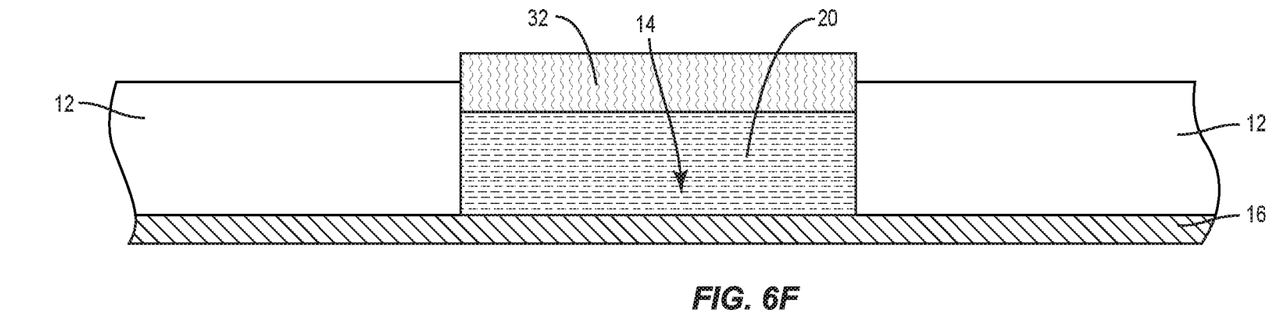

A first sintering step is followed to sinter the sinterable base material 30 within the opening 14 to form the sintered base component 20, as illustrated in FIG. 6F (Step 510). Since the evaporation temperature of the contact binder material (in the sinterable contact material 32) is higher than the evaporation temperature of the first or second base binder material (in the sinterable base material 30), the first sintering temperature is eligible to be set to only evaporate the first or second base binder material used in the sinterable base material 30, but not to evaporate the contact binder material used in the sinterable contact material 32. During the first sintering step, the first or second base binder material from the sinterable base material 30 escapes away into the external ambience without being trapped by the sinterable contact material 32. The sinterable base material 30 solidifies into sintered form as the sintered base component 20 while the sinterable contact material 32 is not solidified.

Figure 6G:
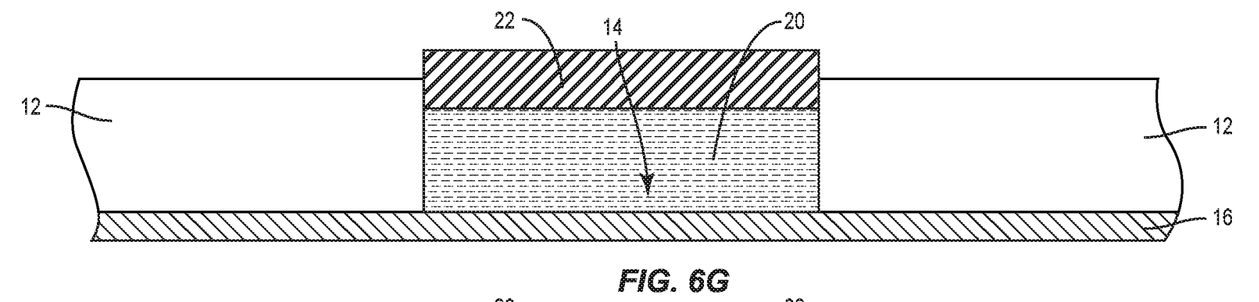

Once the first or second base binder material evaporates, the first sintering temperature is raised to the second sintering temperature, and the sinterable contact material 32 is sintered to form the sintered contact film 22, as illustrated in FIG. 6G (Step 512). During the second sintering step, the contact binder material within the sinterable contact material 32 evaporates and escapes away into the external ambience, such that the sinterable contact material 32 solidifies into sintered form as the sintered contact film 22. As a result, the sintered base component 20 is confined within the opening 14 by the substrate body 12 on sides, by the first foil layer 16 on the bottom, and by the sintered contact film 22 on the top.

Figure 6H:
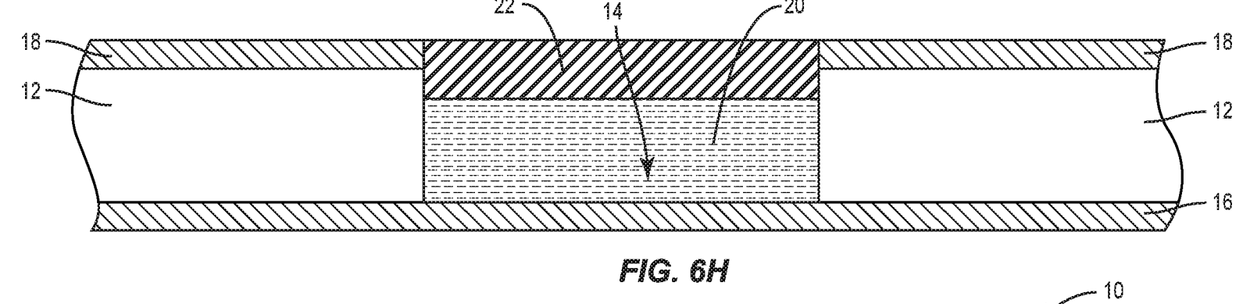

Next, the second foil layer 18 is formed over the substrate body 12 and surrounding the sintered contact film 22, as illustrated in FIG. 6H (Step 514). The second foil layer 18 may not extend over the sintered contact film 22 and the sintered base component 20. The second foil layer 18 may be formed of copper, and may have a thickness between 5 µm and 35 µm, or between 5 µm and 75 µm. A polishing step may be applied to planarize the top surface of the sintered contact film 22, and/or the top surface of the second foil layer 18 (not shown). Herein, the top surface of the sintered contact film 22 and the top surface of the second foil layer 18 may be at a same flat plane. In some applications, the second foil layer 18 may be formed before applying the sinterable base material 30 and the sinterable contact material 32, or before sintering the sinterable base material 30 and the sinterable contact material 32.

Figure 6I:
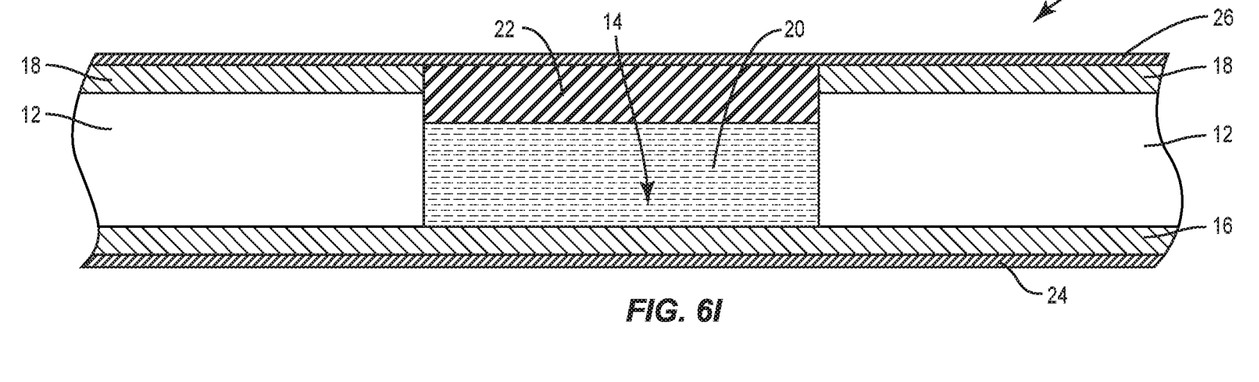

Lastly, the first surface finish 24 and second surface finish 26 may be applied, as illustrated in FIG. 6I (Step 516). The first surface finish 24 is formed underneath the first foil layer 16, and the second surface finish 26 is formed over the second foil layer 18 and the sintered contact film 22. The first surface finish 24 and the second surface finish 26 may help planarize any surficial non-uniformities arising from the sintering steps. In some application, the first surface finish 24 and/or the second surface finish 26 may not be applied.

In one embodiment, the first sintering step may be executed after the sinterable base material 30 is applied but before the sinterable contact material 32 is applied (not shown). As such, the sinterable base material 30 is sintered to form the sintered base component 20 before the sinterable contact material 32 is applied. Consequently, the sinterable contact material 32 is applied over the sintered base component 20 instead of the sinterable base material 30. The second sintering step is then followed.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
   a substrate body having a first opening through the substrate body;
   a first foil layer formed underneath the substrate body and extending underneath the first opening, such that a first portion of the first foil layer fully covers a bottom of the first opening;
   a first sintered base component formed within the first opening and over the first portion of the first foil layer, wherein the first sintered base component has a dielectric constant between 10 and 500, or has a relative permeability greater than 5; and
   a first sintered contact film formed over the first sintered base component, wherein the first sintered base component is confined within the first opening by the substrate body on sides, by the first foil layer on bottom, and by the first sintered contact film on top.

2. The apparatus of claim 1 wherein the first sintered base component has a dielectric constant between 10 and 500.

3. The apparatus of claim 2 wherein the first sintered base component comprises at least one of a group consisting of barium strontium titanate (BST), aluminum nitride, and aluminum oxide.

4. The apparatus of claim 1 wherein the first sintered base component has a relative permeability greater than 5.

5. The apparatus of claim 4 wherein the first sintered base component comprises at least one of a group consisting of iron, nickel, cobalt, and neodymium.

6. The apparatus of claim 1 wherein the first sintered contact film comprises at least one of a group consisting of copper, silver and gold.

7. The apparatus of claim 1 wherein the first sintered contact film has a thickness between 100 µm and 200 µm.

8. The apparatus of claim 1 further comprising a second sintered base component and a second sintered contact film, wherein:
  the substrate body further includes a second opening through the substrate body;
  the first foil layer extends underneath the second opening, such that a second portion of the first foil layer fully covers a bottom of the second opening;
  the second sintered base component is formed within the second opening and over the second portion of the first foil layer, wherein the second sintered base component has a dielectric constant between 10 and 500, or has a relative permeability greater than 5; and
  the second sintered contact film is formed over the second sintered base component, wherein the second sintered base component is confined within the second opening by the substrate body on sides, by the first foil layer on the bottom, and by the second sintered contact film on the top.

9. The apparatus of claim 8 wherein each of the first sintered base component and the second sintered base component has a dielectric constant between 10 and 500.

10. The apparatus of claim 9 wherein the first sintered base component and the second sintered base component have a same dielectric constant.

11. The apparatus of claim 9 wherein the first sintered base component and the second sintered base component have different dielectric constants.

12. The apparatus of claim 8 wherein each of the first sintered base component and the second sintered base component has a relative permeability greater than 5.

13. The apparatus of claim 12 wherein the first sintered base component and the second sintered base component have a same relative permeability.

14. The apparatus of claim 12 wherein the first sintered base component and the second sintered base component have different relative permeabilities.

15. The apparatus of claim 8 wherein the first sintered base component has a dielectric constant between 10 and 500, and the second sintered base component has a relative permeability greater than 5.

16. The apparatus of claim 1 further comprising a surface finish formed underneath the first foil layer, wherein the surface finish is one of a group consisting of electroless nickel electroless palladium immersion gold (ENEPIG) finish, bussed nickel gold (NiAu) finish, bussless NiAu finish, and electroless nickel immersion gold (ENIG) finish.

17. The apparatus of claim 1 further comprising a second foil layer, which is formed over the substrate body and surrounds the first sintered contact film, wherein the second foil layer does not extend over the first opening.

18. The apparatus of claim 17 wherein the first foil layer and the second foil layer are formed of copper.

19. The apparatus of claim 17 further comprising a surface finish formed over the second foil layer, wherein the surface finish is one of a group consisting of electroless nickel electroless palladium immersion gold (ENEPIG) finish, bussed nickel gold (NiAu) finish, bussless NiAu finish, and electroless nickel immersion gold (ENIG) finish.

20. The apparatus of claim 19 wherein the surface finish does not extend over the first opening, such that the first sintered contact film is exposed.

21. The apparatus of claim 19 wherein the surface finish extends over the first sintered contact film.

22. The apparatus of claim 1 wherein a top surface of the first sintered base component is below a top surface of the substrate body with a distance between 0 µm and 300 µm.

* * * * *